(12) United States Patent
Eleftheriou et al.

(10) Patent No.: US 8,446,759 B2
(45) Date of Patent: May 21, 2013

(54) MULTILEVEL PROGRAMMING OF PHASE CHANGE MEMORY

(71) Applicant: International Business Machines Corporation, Armonk, NY (US)

(72) Inventors: Evangelos S. Eleftheriou, Zurich (CH); Angeliki Pantazi, Zurich (CH); Nikolaos Papandreou, Zurich (CH); Charalampos Pozidis, Zurich (CH); Abu Sebastian, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/685,077

(22) Filed: Nov. 26, 2012

(65) Prior Publication Data

US 2013/0083594 A1   Apr. 4, 2013

Related U.S. Application Data

(62) Division of application No. 12/861,947, filed on Aug. 24, 2010, now Pat. No. 8,351,251.

(30) Foreign Application Priority Data

Aug. 27, 2009   (EP) .................................... 09168861

(51) Int. Cl.
*G11C 11/00*   (2006.01)

(52) U.S. Cl.
USPC ............ 365/163; 365/148; 365/158; 977/754

(58) Field of Classification Search
USPC ............. 365/46, 94, 100, 113, 129, 148, 158, 365/163; 257/2–5, 9, 296, 310, E21.35, E31.047, E27.006; 438/29, 95, 96, 166, 135, 438/240, 259, 365, 482, 486, 597, 785; 977/754

See application file for complete search history.

(56) References Cited

U.S. PATENT DOCUMENTS

| | | | |
|---|---|---|---|
| 7,978,508 B2 * | 7/2011 | Czubatyj ........................ | 365/163 |
| 8,004,884 B2 * | 8/2011 | Franceschini et al. ......... | 365/163 |
| 2008/0084738 A1 | 4/2008 | Philipp et al. | |
| 2010/0182826 A1 * | 7/2010 | Czubatyj ........................ | 365/163 |
| 2011/0026318 A1 * | 2/2011 | Franceschini et al. ......... | 365/163 |

OTHER PUBLICATIONS

F. Bedeschi, et al., "A Bipolar-Selected Phase Change Memory Featuring Multi-Level Cell Storage", IEEE Journal of Solid-State Circuits, vol. 44, No. 1, Jan. 2009, pp. 217-227.

* cited by examiner

*Primary Examiner* — Harry W Byrne
(74) *Attorney, Agent, or Firm* — Cantor Colburn LLP; Vazken Alexanian

(57) ABSTRACT

A method and device for performing a program operation of a phase change memory (PCM) cell. The method includes the steps of applying one or more programming pulses according to a predefined programming scheme to achieve a target resistance level of the PCM cell, wherein the programming scheme is operable to perform in a first programming mode one or more annealing steps to approach the target resistance, wherein the programming scheme is operable to perform in a second programming mode one or more melting steps, wherein the programming scheme is operable to start in the first programming mode and to switch to the second programming mode if the target resistance level of the PCM cell has been undershot in the first programming mode.

12 Claims, 9 Drawing Sheets

MULTILEVEL PROGRAMMING OF PHASE CHANGE MEMORY

CROSS-REFERENCE TO RELATED APPLICATION

This application is a divisional of U.S. patent application Ser. No. 12/861,947, filed Aug. 24, 2010, which claims priority under 35 U.S.C. §119 from European Patent Application No. 09168861.4, filed Aug. 27, 2009, the entire contents of which are incorporated by reference herein.

BACKGROUND

1. Field of the Invention

The present invention relates to a method of performing a program operation of a phase change memory (PCM) cell. The present invention is further related to a corresponding pulse generator, a corresponding memory device and a corresponding computer program.

2. Description of the Related Art

Phase change memory (PCM) is a nonvolatile solid-state memory paradigm that exploits the property of reversible switching of certain chalcogenide materials between two stable states with very high resistivity contrast. The states of low/high resistivity are known as (poly-) crystalline and amorphous respectively. PCM has emerged in recent years as a potential successor of flash memory technology, because of its excellent read/write endurance, throughput performance, and future scaling. Multilevel functionality (multiple bits per unit memory cell) is a way to increase capacity without increasing cost, and thereby to reduce the cost per bit.

Storage of multiple resistance levels in a PCM cell is a challenge. Issues like process variability, as well as intra-cell and inter-cell material parameter variations give rise to deviations of the achieved resistance levels from their intended values. One way to resolve this issue is to resort to iterative programming schemes, with multiple write-verify steps until a desired resistance level is reached.

Bedeschi, et al. discloses in "A Bipolar-Selected Phase Change Memory Featuring Multi-Level Cell Storage", IEEE Journal of Solid State Physics, VOL. 44, NO. 1, January 2009, a programming scheme that applies write pulses with heights that are incrementally increased to approach the target resistance.

US 2008/0084738 A1 discloses a method that starts in a crystalline mode and applies melting pulses to gradually amorphize.

The present invention provides another method of performing a program operation of a phase change memory cell.

SUMMARY

The present invention is directed to methods, a pulse generator, a memory device and a computer program.

According to an embodiment of the present invention, there is provided a method of performing a program operation of a phase change memory (PCM) cell. The method includes the steps of:

applying one or more programming pulses according to a predefined programming scheme to achieve a target resistance level of the PCM cell, wherein the programming scheme is operable to perform in a first programming mode one or more annealing steps to approach the target resistance level, wherein the programming scheme is operable to perform in a second programming mode one or more melting steps, wherein the programming scheme is operable to start in the first programming mode and to switch to the second programming mode if the target resistance level of the PCM cell has been undershot in the first programming mode.

According to another embodiment of the present invention, there is provided a programming device for applying one or more programming pulses according to a predefined programming scheme to one or more Phase Change Memory (PCM) cells to achieve a target resistance level of the PCM cells. The programming device includes:

a pulse generator; a control circuit for controlling the pulse generator according to the predefined programming scheme, wherein the programming scheme is operable to perform in a first programming mode one or more annealing steps to approach the target resistance level, wherein the programming scheme is operable to perform in a second programming mode one or more melting steps, wherein the programming scheme is operable to start in the first programming mode and to switch to the second programming mode if the target resistance level of the PCM cell has been undershot in the first programming mode.

According to a further embodiment of the present invention, there is provided a memory device including one or more phase change memory (PCM) cells and a programming device according to an aspect of the invention.

According to a further embodiment of the present invention, there is provided a computer program including instructions for carrying out a programming scheme of a control circuit, the control circuit being operable to control a pulse generator of a memory device, which includes one or more phase change memory (PCM) cells, wherein the programming scheme is operable to perform in a first programming mode one or more annealing steps to approach a target resistance level of the PCM cells, wherein the programming scheme is operable to perform in a second programming mode one or more melting steps, wherein the programming scheme is operable to start in the first programming mode and to switch to the second programming mode if the target resistance level of the PCM cell has been undershot in the first programming mode.

The steps of the different embodiments and aspects of the invention can be performed in different orders. Furthermore, the steps may also be combined, for example two or more steps are performed together.

Any features of one aspect of the invention may be applied to the features of the other aspects of the invention. Advantages of features of one aspect of the invention may apply to corresponding features of the other aspects of the invention.

DETAILED DESCRIPTION

Figure 1:
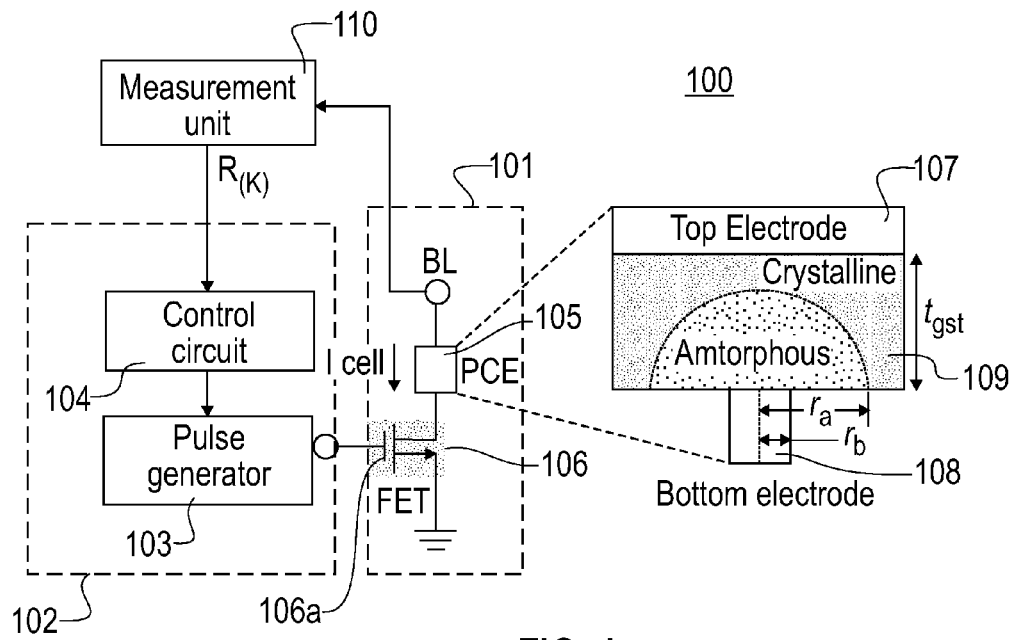
FIG. 1 is a block diagram of a memory device including a Phase Change Memory (PCM) cell, a pulse generator and a control circuit according to an embodiment of the present invention.

In this specification, the term resistance-current (R-I) curve of the PCM cell is understood as the resistance-current-curve that starts from RESET-state. The resistance-current (R-I) curve may also be denoted as RESET R-I-curve. In this specification, the terms resistance-current curve, R-I-curve and RESET R-I-curve are used interchangeably. The resistance is the respective resistance of the PCM cell and the current the corresponding pulse amplitude of the current that is applied to the PCM cell starting from RESET-state.

In this specification the term resistance-gate voltage (R-Vg) curve of the PCM cell is understood as the resistance-gate voltage-curve that starts from RESET-state. The resistance-gate voltage-curve may also be denoted as R-Vg-curve. In this specification the terms resistance-gate voltage-curve, R-Vg-curve and RESET R-Vg-curve are used interchangeably. The resistance is the respective resistance of the PCM cell and the gate voltage that is applied to a FET that controls the current of the PCM cell. Preferred embodiments of the present invention are described in detail below, by way of example only, with reference to the drawings.

The drawings are provided for illustrative purposes only and do not necessarily represent practical examples of the present invention to scale. In the figures, same reference signs are used to denote the same or like parts.

As an introduction to the following description, it is first pointed at general aspects of the present invention. Embodiments of the present invention are directed to methods of performing a program operation of a phase change memory (PCM) cell. According to embodiments of the present invention, one or more programming pulses may be applied to the PCM cell according to a predefined programming scheme in order to achieve a target resistance level of the PCM cell.

According to embodiments of the present invention, the programming scheme is provided to set two or more different target resistance levels for the PCM cell. A PCM cell may include a Phase Change Element (PCE) and some additional circuitry, in particular an access device such as a transistor, for example a Field Effect Transistor. The PCE may include a memory element and electrodes. The memory element may include a phase change material. The programming scheme includes a first programming mode and a second programming mode. In order to set a new target resistance level of the PCM cell, the programming scheme starts preferably in the first programming mode. When starting the first programming mode, the current resistance level of the PCM cell is typically higher than the target resistance level.

According to an embodiment of the present invention, before starting the first programming mode a full RESET pulse has been applied to the PCM cell and accordingly the first programming mode starts with a high resistance level of the PCM cell. In the first programming mode, one or more annealing steps may be performed. The programming pulses of the annealing steps heat the phase change material of the memory element of the PCM cell partly above the glass temperature of the phase change material, but below the melting temperature of the phase change material. In other words, during an annealing step one or more regions of the memory element are heated above the glass temperature of the phase change material, but below the melting temperature of the phase change material. This causes a partial crystallization of the memory element and a lower resistance of the PCM cell. However, the electric energy applied to the PCM cell during an annealing step is below the electric energy of a SET-pulse. A SET-pulse is a pulse that results in a full crystallization of the memory element. In other words, an annealing step may be denoted as partial-SET step, meaning that during an annealing step only a part, but not the whole memory element is crystallized.

The programming pulses of the annealing steps are preferably chosen in such a way that they do not cause any melting of the memory element. During an annealing step the resistance of the PCM cell is decreased and the target resistance level is approached from the top. In other words, in the first programming mode the PCM cell is operated on the left programming slope of the resistance-current curve of the PCM cell or on the left programming slope of the resistance-voltage curve of the PCM cell respectively. If after an annealing step the target resistance level has been undershot or in other words, if after an annealing step the current resistance level is lower than the target resistance level, the programming scheme according to an embodiment of the invention switches to the second programming mode.

In the second programming mode one or more melting steps are performed. The programming pulses of the melting steps heat the memory element partly above the melting temperature. In other words, according to embodiments of the present invention the programming pulses of the melting steps cause a melting of only a part of the memory element. The electric energy applied to the PCM cell during the melting steps is lower, preferably substantially lower, than the electric energy of a full RESET pulse. A full RESET pulse is understood as a pulse that results in a full amorphization of the memory element. In other words, the melting steps of the second programming mode perform a partial RESET of the PCM cell. During a melting step, the resistance of the PCM cell may be increased or decreased. In the second programming mode the target resistance level may be approached bidirectionally from the top or the bottom. In other words, in the second programming mode the PCM cell is operated on the right programming slope of the resistance-current curve of the PCM cell or on the right programming slope of the resistance-voltage curve of the PCM cell respectively.

Programming schemes according to embodiments of the present invention may achieve multiple resistance levels in a PCM cell by applying a sequence of programming pulses, in particular pulses of constant width and variable amplitude. The shape of the programming pulses may be substantially rectangular. Programming schemes according to embodiments of the invention may be based on an iterative process of write-and-read steps using an adaptive algorithm that controls the amplitude of the next programming pulse. Programming schemes according to embodiments of the present invention may take advantage of the characteristic resistance-current (R-I) curve or resistance-voltage (R-V) curve of the PCM cell and may utilize the full programming region, that is, the left and the right programming slopes by applying transitions between the two programming slopes in case of overshoot or undershoot.

Programming schemes according to embodiments of the present invention may provide several advantages as follows:

By operating in two programming modes, the need for re-initialization in case of undershoot can be avoided. In other words, by operating in two programming modes full-RESET pulses can be avoided. This can reduce the total programming time, that is, a lower number of pulses may be needed for reaching the target resistance level. In addition, the total power can be reduced as no full-RESET is required. Furthermore, an efficient transition between the first and the second programming mode enables the programming scheme to mostly utilize the left programming slope of the R-I curve of the PCM cell. This may result in scarce usage of melt-quench steps, less power consumption, lower material stress and thus higher endurance.

Programming schemes according to embodiments of the present invention may be efficient in terms of dissipated power and total programming time. This may support embedded applications and high write data rates and avoid jeopardizing the endurance of the PCM cells due to repeated overheating. Programming schemes according to embodiments of the present invention may effectively reduce the number of write-read steps and the power spent in each step.

The left-side of the R-I curve or of a corresponding R-Vg curve allows only one-directional writing, that is, the resistance R can only be decreased by applying annealing steps. The right-side of the R-I curve allows bi-directional writing, but at the expense of higher power consumption, higher stress of cells and lower endurance of the PCM cell. Programming schemes according to embodiments of the invention combine the low energy programming of the left side of the R-I curve or a corresponding R-Vg curve with the bi-directional flexibility of the right side of the R-I curve or a corresponding R-Vg curve. This allows for improved solutions in terms of programming latency, device reliability and robustness of convergence.

FIG. 1 is a block diagram of a memory device 100 including a Phase Change Memory (PCM) cell 101 and a programming device 102. The programming device 102 includes a pulse generator 103 and a control circuit 104. The PCM cell 101 includes a Phase Change Element (PCE) 105 and a Field Effect Transistor (FET) 106. The pulse generator 103 generates voltage pulses and applies these voltage pulses to the gate electrode 106a of the Field Effect Transistor (FET) 106. The current Icell that is flowing through the PCM cell 101 is controlled by the gate voltage of the FET 106. The PCE 105 includes a top electrode 107 and a bottom electrode 108. Between the top electrode 107 and the bottom electrode 108 is arranged a memory element 109 that employs a phase change material 109 and exhibits a reversible phase change. The memory device 100 includes a measurement unit 110 that measures the resistance of the PCM cell 101 and that delivers a resistance value R(k) to the control circuit 104.

Figure 2:
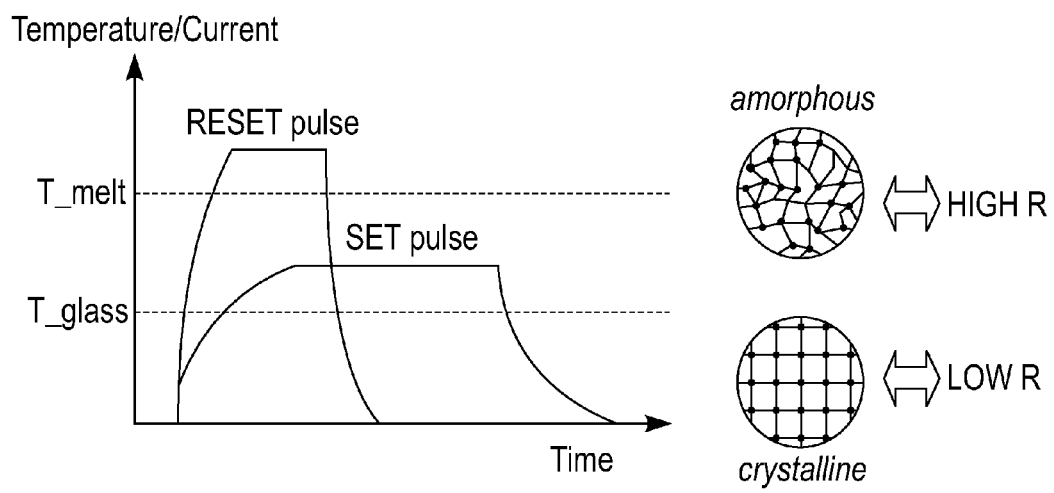
FIG. 2 shows a diagram illustrating a SET pulse and a RESET pulse used to switch a PCM cell between an amorphous state and a crystalline state.

FIG. 2 shows a diagram illustrating a SET pulse and a RESET pulse used to switch a PCM cell between a fully amorphous state and a fully crystalline state. In the fully amorphous state the material of the PCM cell is fully amorphous and the PCM cell has a maximum resistance level. In the fully crystalline state the material of the PCM cell is fully crystalline and the PCM cell has a minimum resistance level.

Switching between states is enabled by Joule heating. Applying a SET pulse means to heat the material above its glass temperature Tglass and hold for a time sufficient to allow crystallization. This results in an ordered crystalline state. Applying a RESET pulse means to apply a high and sharp pulse to completely melt the material and then rapidly cool the material to retain the disorder from the liquid state. This results in a disordered amorphous state of the PCM material. Between the amorphous state and the crystalline state there are a plurality of intermediate states, which correspond to intermediate resistance levels of the PCM cell.

Figure 3:
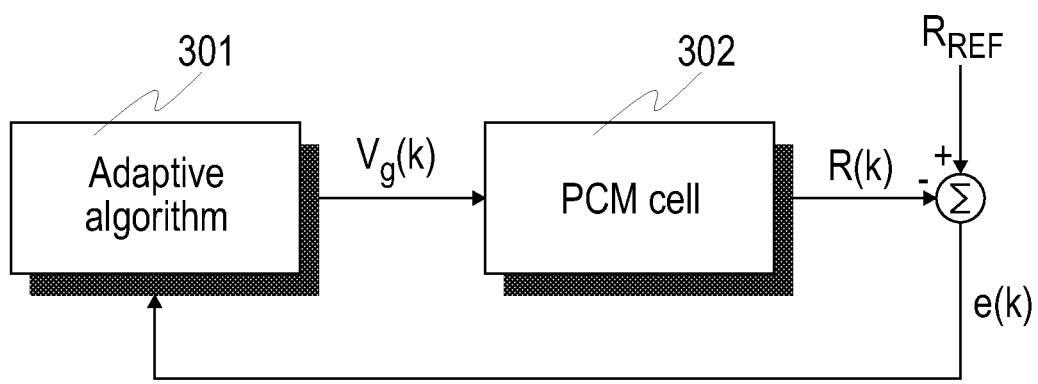
FIG. 3 is a block diagram of a system for performing an iterative multi-level programming scheme of a Phase Change Memory (PCM cell) cell according to an embodiment of the present invention.

FIG. 3 shows a block diagram of a system 300 for performing an iterative multi-level programming scheme of a Phase Change Memory (PCM) cell according to an embodiment of the present invention. The system 300 includes a block 301 for calculating the voltage of a transistor that controls the current of a PCM cell 302, for example, the gate voltage Vg of a FET, for example, the FET 106 as described with reference to FIG. 1. The gate voltage Vg may be in particular determined by an adaptive algorithm. The block 301 may include, for example, a pulse generator 103 and a control circuit 104 as illustrated with reference to FIG. 1.

The adaptive algorithm starts from an initial state, which may be in particular the RESET state.

If the initial state is the RESET state, a RESET pulse is applied to the PCM cell 302 and the initial gate voltage is set to Vg(0)=Vinit.

Vinit is chosen based on the R-I curve of the PCM cell 302 or equivalently based on the R-Vg curve of the PCM cell 302. The error value e(k) may be defined in the linear or log domain. As an example, in the linear domain the error value e(k) may be defined as e(k)=RREF−R(k), wherein RREF is the target resistance level and R(k) is the current resistance level. The gate voltage to be applied in the next iteration Vg (k+1) is then determined as follows:

$$Vg(k+1)=Vg(k)+\alpha \cdot e(k)$$

The gain $\alpha$ may affect the variance of the error around RREF and the speed of convergence.

According to other embodiments of the present invention other adaptive algorithms may be used, for example:

$$Vg(k+1)=Vg(k)+\alpha \cdot e(k)+\beta \cdot R(k)$$

According to another embodiment, instead of a constant gain $\alpha$ a variable gain $\alpha(k)$ can be used, which is calculated at each iteration. This may enhance the speed of convergence.

According to another embodiment of the present invention, the adaptive algorithm may be configured to regulate on a reference value for the current that flows through the Phase Change Element, that is, a target current level IREF. In that case, the output of the READ operation is the current level flowing through the PCE at iteration k of the algorithm, that is I(k). Accordingly, the error value at iteration k is defined as e(k)=IREF−I(k) in this case, and may also be defined in the log domain.

The programming pulses can be voltage or current pulses. Applying a gate voltage Vg is one example of a voltage-controlled current pulse for a Field Effect Transistor (FET) access device. Other access or control devices may use other control elements, for example bipolar transistors or any other control elements suitable for heating the PCM cell.

Figure 4:
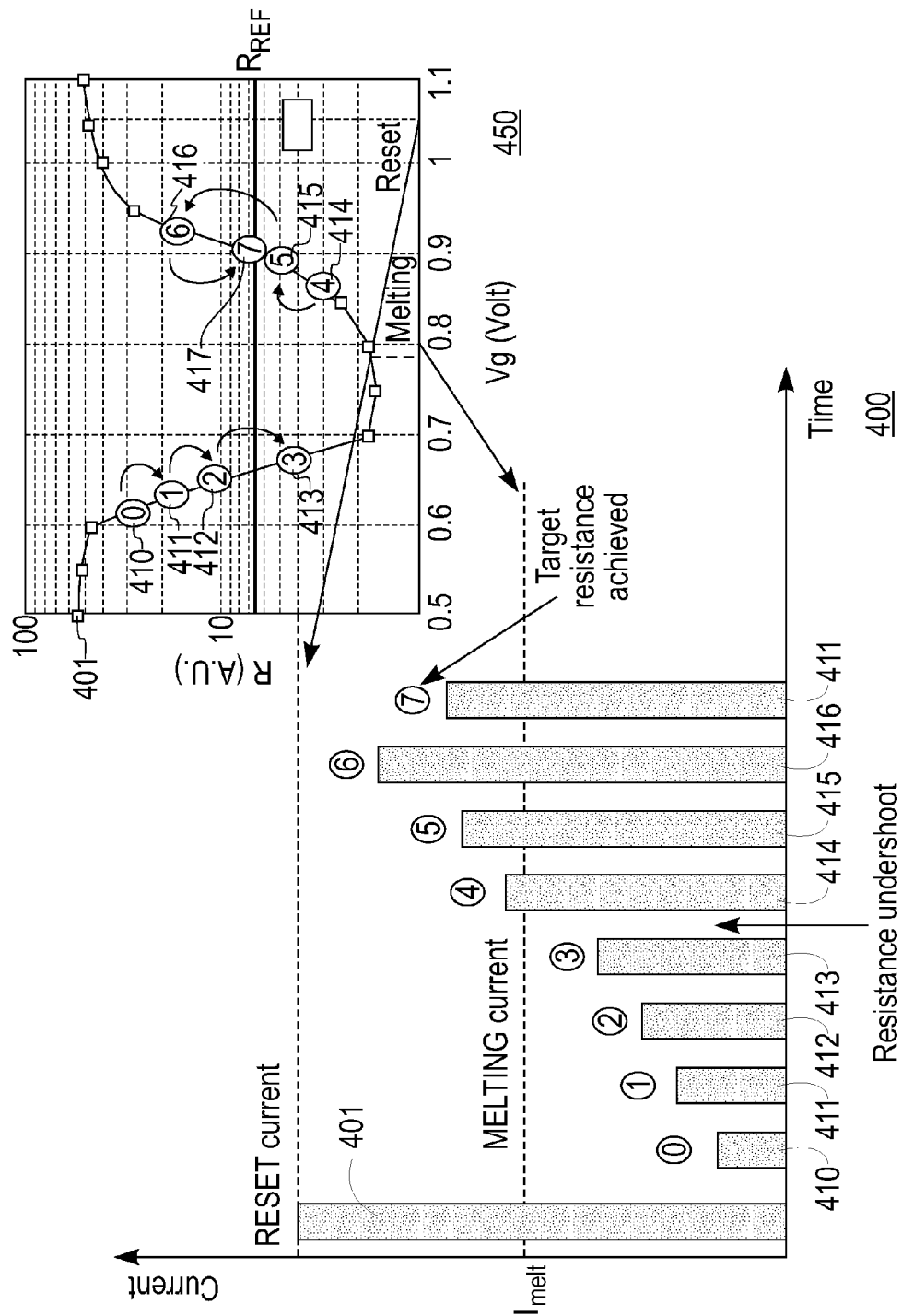
FIG. 4 shows a diagram illustrating the current of programming pulses over time of a programming scheme of a PCM cell according to an embodiment of the present invention and a corresponding resistance-gate voltage diagram of the PCM cell.

FIG. 4 shows a diagram 400 illustrating the current of programming pulses over time of a programming scheme of a PCM cell according to an embodiment of the present invention and a corresponding Resistance-Gate Voltage (R-Vg) diagram (curve) 450 showing on the vertical axis the resistance R in Arbitrary Units (A.U.) of the PCM cell and on the horizontal axis the applied gate voltage Vg of a FET that controls the current Icell applied to the respective PCM cell.

In this embodiment, the programming scheme starts with applying a RESET-pulse 401 that results in a full or maximum amorphization of the PCM cell. The corresponding resistance level of the PCM cell at the R-Vg diagram 450 is illustrated with reference number 401 as well.

After the reset pulse 401, the programming scheme starts to approach the target resistance level RREF in a first programming mode by performing annealing steps 410-413. The annealing steps 410-413 apply a current Icell whose amplitude is below the melting current Imelt of the phase change material of the memory element. In other words, the pulses of the annealing steps do not cause any melting of the material of the memory element. The melting current may be defined as the threshold current above which a part of the memory element is heated up during a pulse above the melting temperature. The pulses applied by the annealing steps 410-413 have a rectangular form and their amplitude is increased incrementally step by step.

The corresponding resistance points on the R-Vg diagram 450 that have been reached after applying each of the annealing steps 410-413 are illustrated with reference numbers 410-413 as well. Referring to the corresponding diagram R-Vg 450, the programming scheme operates in the first mode on the left programming slope of the R-Vg curve of the PCM cell. The annealing step 413 has resulted in an undershoot of the target resistance level RREF, that is, after the annealing step 413 the resistance of the PCM cell is below the target resistance level RREF. Now the programming scheme according to an embodiment of the present invention switches to a second programming mode, also denoted as second mode of operation. In the second programming mode the programming scheme performs one or more melting steps, in this example four melting steps 414, 415 and 416 and 417. The current Icell applied to the PCM cell during the melting steps is above the melting current Imelt. In other words, the programming pulses of the melting steps cause a melting of a part of the memory element of the PCM cell or of one or more regions of the memory element of the PCM cell.

Referring to the corresponding R-Vg diagram 450, the programming scheme switches in the second programming mode to the right programming slope of the resistance-gate voltage curve of the PCM cell. The resistance after the first melting step 414 is below the target resistance level RREF. Accordingly, in the subsequent melting step 415 the melting current is increased. The melting step 415 has resulted in a resistance that is below the target resistance level RREF. Accordingly, in the subsequent melting step 416 the melting current is increased. The melting step 416 has resulted in a resistance that is above the target resistance level RREF. Accordingly, in the subsequent melting step 417 the melting current is decreased. The resistance after the melting step 417 is equal to the target resistance RREF or is within the error margin of the target resistance level RREF. Hence, the programming scheme according to the example illustrated with reference to FIG. 4 terminates successfully.

Figure 5:
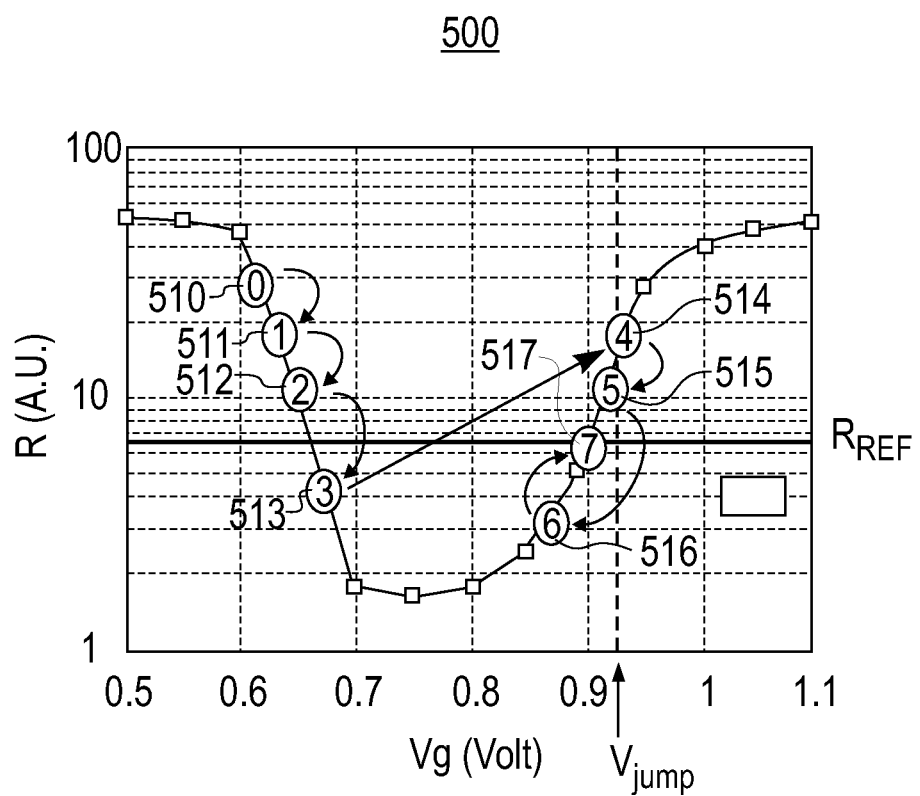
FIG. 5 is a resistance-gate voltage diagram of a programming scheme of a PCM cell according to an embodiment of the present invention.

FIG. 5 shows a Resistance-Gate Voltage (R-Vg) diagram 500 of a programming scheme of a PCM cell according to an embodiment of the present invention including on the vertical axis the resistance in Arbitrary Units (A.U.) of the PCM cell and on the horizontal axis the applied gate voltage Vg of a FET that controls the current Icell of the PCM cell.

The programming scheme starts to approach the target resistance level RREF in a first programming mode by performing annealing steps 510-513. During the annealing steps 510-513 current is applied to the corresponding PCM cell whose amplitude is below the melting current Imelt of the PCM cell.

The annealing step 513 has resulted in an undershoot of the target resistance level RREF, that is, after the annealing step 513 the resistance of the PCM cell is below the target resistance level RREF. The programming scheme according to an embodiment of the invention switches to a second programming mode. In the second programming mode the programming scheme performs one or more melting steps, in this example four melting steps 514, 515, 516 and 517. The current Icell applied to the PCM cell during the melting step is above the melting current Imelt. The resistance after the first melting step 514 is above the target resistance level RREF. Accordingly, in the subsequent melting step 515 the melting current is decreased. The melting step 515 has again resulted in a resistance that is above the target resistance level RREF. Accordingly, in the subsequent melting step 516 the melting current is decreased again. The melting step 516 has resulted in a resistance that is below the target resistance level RREF. Accordingly, in the subsequent melting step 517 the melting current is increased. Finally, the resistance after the melting step 517 is equal to the target resistance or is within the range of error margin of the target resistance level RREF and the programming algorithm terminates successfully.

Figure 6:
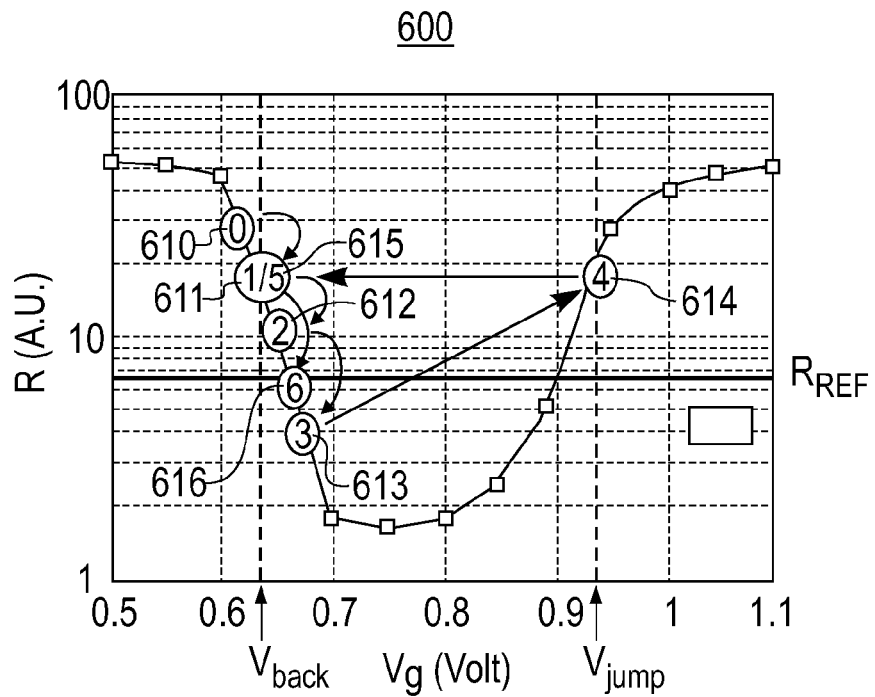
FIG. 6 is a resistance-gate voltage diagram of another programming scheme of a PCM cell according to an embodiment of the present invention.

FIG. 6 shows a Resistance-Gate Voltage (R-Vg) diagram 600 of a programming scheme of a PCM cell according to an embodiment of the present invention including on the vertical axis the resistance in Arbitrary Units (A.U.) of the PCM cell and on the horizontal axis the applied gate voltage Vg that controls the current of the PCM cell.

The programming scheme 600 starts to approach the target resistance level RREF in a first programming mode by performing annealing steps 610-613. The annealing steps 610-613 apply a current whose amplitude is below the melting current Imelt of the PCM cell. The annealing step 613 has resulted in an undershoot of the target resistance level RREF, that is, after the annealing step 613 the resistance of the PCM cell is below the target resistance level RREF. The programming scheme according to this embodiment of the present invention switches then to the second programming mode.

In this embodiment in the second programming mode there is performed a melting step 614. The melting step 614 may be denoted as jump step as in this example the programming scheme jumps from the left programming slope of the R-Vg curve to the right programming slope in a single jump step. The applied gate voltage Vg may be denoted as jump voltage Vjump. The point of the R-Vg curve that corresponds to the jump step 614 of the programming curve may be denoted as switch back point. The switch back point is the point from which the programming scheme is operable to switch back from the second programming mode to the first programming mode or in other words from the right programming slope to the left programming slope.

According to the embodiment as illustrated with reference to FIG. 6 the programming scheme switches or moves back from the right programming slope to a return point of the left programming slope by performing a re-initialization of the gate voltage Vg in an initialization step 615. In this example the initialization step 615 has resulted in the same point of the R-Vg-curve as the former annealing step 611.

The initialization step 615 maps the current resistance level of the right slope to a corresponding pulse amplitude of the left slope. In other words, the voltage Vback is determined that corresponds to the same resistance level on the left slope as compared to the current resistance level on the right slope.

According to this embodiment of the present invention, the return point corresponding to initialization step 615 of the left programming slope is chosen above the target resistance level RREF of the PCM-cell. This has the advantage that it allows another annealing step to approach the target resistance level on the left programming slope. According to other embodiments of the present invention, the return point may be chosen within the error margin of the target resistance level RREF. After the initialization step 615, another annealing step 616 is performed by applying the following formula:

$$Vg(k+1)=Vback+\alpha \cdot e(k)$$

In this example it is assumed that the PCM cell reaches the target resistance level RREF by the annealing step 616.

Figure 7:
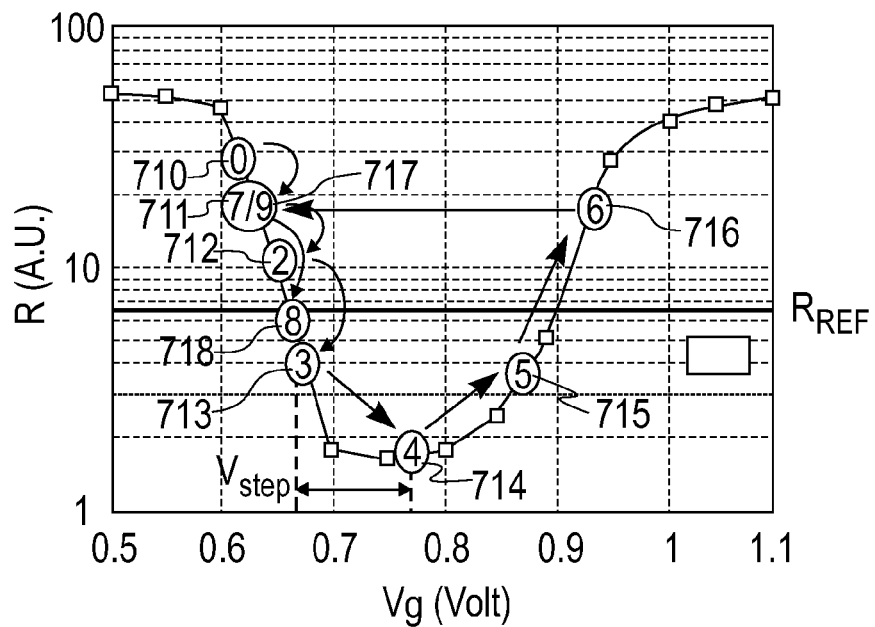
FIG. 7 is a resistance-gate voltage diagram of another programming scheme of a PCM cell according to an embodiment of the present invention.

FIG. 7 shows a Resistance-Gate Voltage (R-Vg) diagram 700 of a programming scheme of a PCM cell according to another embodiment of the present invention including on the vertical axis the resistance in Arbitrary Units (A.U.) of the PCM cell and on the horizontal axis the applied gate voltage Vg of a FET that controls the current of the PCM cell.

The programming scheme 700 starts to approach the target resistance level RREF in a first programming mode by performing annealing steps 710-713 in a similar manner as described with reference to FIG. 6. The annealing steps 710-713 apply a current Icell whose amplitude is below the melting current Imelt of the PCM cell. The annealing step 713 has resulted in an undershoot of the target resistance level RREF, that is, after the annealing step 713 the resistance of the PCM cell is below the target resistance level RREF. The programming scheme according to this embodiment of the invention switches then to the second programming mode. In particular, it moves from the left programming slope to a switch back point of the right programming slope in three intermediate steps 714, 715 and 716 which correspond to predetermined equal increments of the gate voltage Vg. In other words, although the iterative write-read steps are still performed, the adaptive algorithm calculating Vg(k+1) is temporarily altered until the new resistance level, R(k), is above or within the error margin of the target resistance RREF. The modified adaptive algorithm calculates the new Vg at iteration k+1 as $$Vg(k+1)=Vg(k)+V_{STEP},$$

wherein $V_{STEP}$ is a small increment of the gate voltage.

Again the point of the R-Vg curve corresponding to melting step 716 is the point from which the programming scheme is operable to switch back from the second programming mode to the first programming mode. In an initialization step 717, the programming scheme switches back from the right programming slope to a return point of the left programming slope. In this example the initialization step 717 has resulted in the same point of the R-Vg-curve as the former annealing step 711.

After the initialization step 717 another annealing step 718 is performed. In this example it is assumed that the PCM cell reaches the target resistance level RREF with the annealing step 718.

Figure 8:
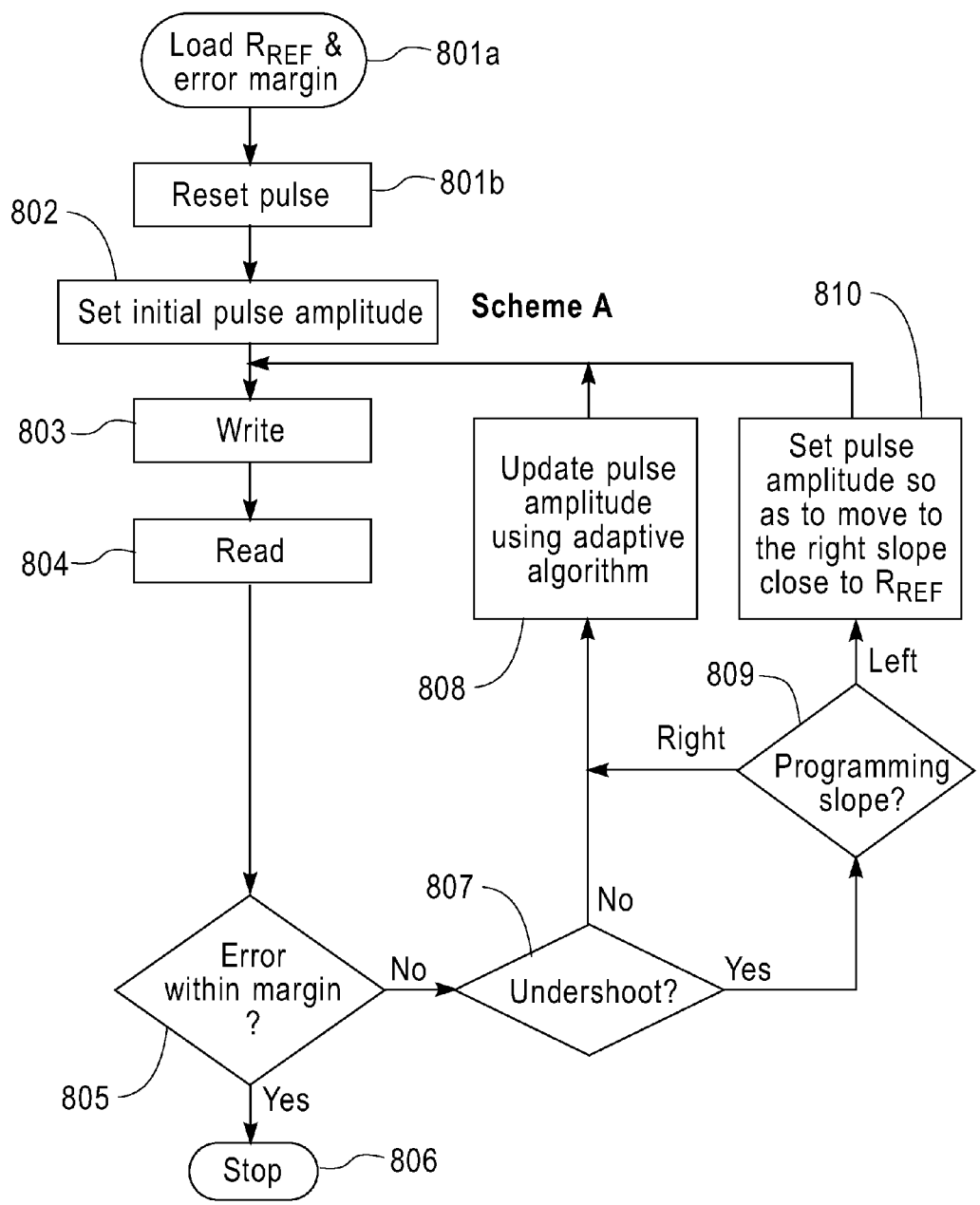
FIG. 8 is a flow chart of a programming scheme of a PCM cell according to an embodiment of the present invention.

FIG. 8 is a flow chart of a programming scheme of a PCM cell according to an embodiment of the present invention. It corresponds to a scheme as described with reference to FIG. 5.

The programming scheme starts in step 801a with loading the target resistance level RREF and an error margin. After step 801a, the PCE is initialized in RESET state in step 801b by applying a RESET pulse. Then in step 802 an initial pulse is set, for example, by the control circuit 104 as described with reference to FIG. 1 and applied in a writing step 803 to the respective PCM cell. In a subsequent reading step 804 the current resistance level of the PCM cell is measured, for example by the measurement unit 110 as described with reference to FIG. 1. In a checking step 805, it is checked whether the error e(k) is within the error margin, that is, whether the absolute value of the difference of the measured resistance level R and the target resistance level RREF is lower than the error margin. If this holds true, the target resistance level has been reached and the programming scheme stops in step 806. If the error e(k) is not within the error margin, it is determined in step 807 whether the target resistance level has been undershot. If no undershoot has been determined in step 807, an amplitude update step is performed in step 808.

In the amplitude update step 808 the amplitude of the next programming pulse is determined for example by means of the adaptive algorithm as described with reference to FIG. 3. The amplitude that is determined may be for example the gate voltage Vg of a FET that controls the current Icell applied to the respective PCM cell. The amplitude of the pulse determined in the amplitude update step 808 is calculated in order to further approach the target resistance level RREF. Then in a subsequent writing step 803 the pulse as determined in step 808 is applied to the PCM cell. Again, in a subsequent reading step 804 the resistance of the PCM cell is measured and in a checking step 805, it is checked whether the error e(k) is now within the error margin. For illustration purposes it is now assumed that in the checking step 805 it is determined that the error is not yet within the error margin.

Furthermore, it is assumed that in step 807 it is found that the target resistance level RREF has been undershot. Then the programming scheme continues with step 809. In step 809 it is determined whether the programming scheme operates on the left or the right programming slope, that is, the left or right side of the R-Vg curve of the PCM cell. In this example the programming scheme is on the left programming slope and the programming scheme continues with step 810. In step 810 a pulse is set that moves the PCM cell to the right slope of the programming curve close to the target resistance level RREF. The amplitude of the pulse that is set in step 810 leads to a partial melting of the PCM cell. Then in another writing step 803 the pulse as determined in step 810 is applied to the PCM cell. Again, in a subsequent reading step 804 the resistance of the PCM cell is measured and in a checking step 805 it is checked whether the error e(k) is now within the error margin. Again it is assumed that in the checking step 805 it is determined that the error is not yet within the error margin.

Furthermore, it is assumed that in step 807 it is found that the target resistance level RREF has been undershot. Then the programming scheme continues with step 809. In step 809 it is determined whether the programming scheme operates on the left or the right programming slope, that is, the left or right side of the R-Vg curve of the PCM cell. In this example the programming scheme is already on the right programming slope and the programming scheme continues with an amplitude update step 808. In the amplitude update step 808 the amplitude of the next programming pulse to be applied in the next iteration is determined, for example, by means of the adaptive algorithm as described with reference to FIG. 3. The amplitude of the pulse determined in the amplitude update step 808 is increased as an undershot has been detected in step 807. Then in another writing step 803 the pulse as determined in step 808 is applied to the PCM cell. Again, in a subsequent reading step 804 the resistance of the PCM cell is measured and in a checking step 805 it is checked whether the error e(k) is now within the error margin. For illustration purposes it is now assumed that in the checking step 805 it is determined that the error is within the error margin and the programming algorithm stops in step 806.

Figure 9:
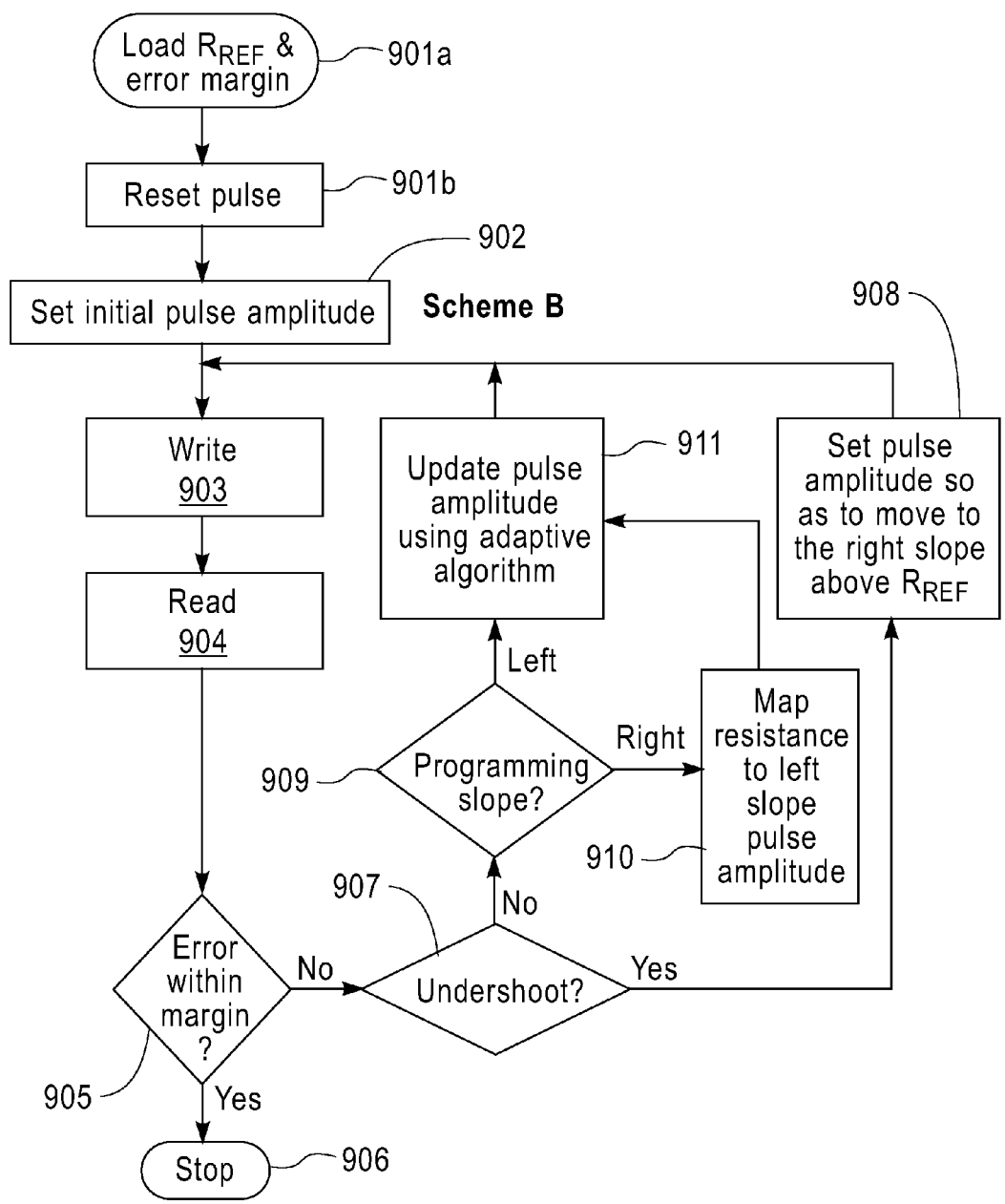
FIG. 9 is a flow chart of a programming scheme of a PCM cell according to another embodiment of the present invention.

FIG. 9 is a flow chart of a programming scheme of a PCM cell according to another embodiment of the present invention. It corresponds to a scheme as described with reference to FIG. 6.

The programming scheme starts in step 901a with loading the target resistance level RREF and an error margin. Then in a step 901b a RESET pulse is applied to initialize the PCM cell to the RESET state. Then in step 902 an initial pulse is set, for example, by the control circuit 104 as described with reference to FIG. 1 and applied in a writing step 903 to the respective PCM cell. In a subsequent reading step 904 the current resistance level of the PCM cell is measured, for example, by the measurement unit 110 as described with reference to FIG. 1. In a checking step 905 it is checked whether the error e(k) is within the error margin, that is, whether the absolute value of the difference of the measured resistance level R and the target resistance level RREF is lower than the error margin. If this holds true, the target resistance level has been reached and the programming scheme stops in step 906. If the error e(k) is not within the error margin, it is determined in step 907 whether the target resistance level has been undershot. If an undershot has been determined in step 907, a pulse is set in step 908 that moves the PCM cell to the right slope of the programming curve above the target resistance level RREF.

By setting the pulse in such a way that the resistance of the PCM cell in the next programming iteration is above the target resistance level RREF, a jump back step to the left programming slope is prepared. Then in another writing step 903 the pulse as determined in step 908 is applied to the PCM cell. Again, in a subsequent reading step 904 the resistance of the PCM cell is measured and in a checking step 905 it is checked whether the error e(k) is now within the error margin. Assuming it is not yet within the error margin, it is determined in step 907 whether the target resistance level has been undershot. As the current resistance level has been moved above RREF, there is no undershoot determined in step 907 and in step 909 it is checked whether the programming scheme operates on the left or the right programming slope. In this example the programming scheme operates on the right programming slope as it has been moved there in the previous step. Then in step 910 the current resistance level is mapped to a corresponding pulse amplitude of the left slope. In other words, a voltage Vback is determined that corresponds to the same resistance level on the left slope as compared to the current resistance level on the right slope. Then in amplitude update step 911 the next pulse amplitude is calculated by applying the following formula:

$$Vg(k+1)=Vback+\alpha \cdot e(k)$$

In another writing step 903 the pulse as determined in step 911 is applied to the PCM cell. Again, in a subsequent reading step 904 the resistance of the PCM cell is measured and in a checking step 905 it is checked whether the error e(k) is now within the error margin. For illustration purposes, it is now assumed that in the checking step 905 it is determined that the error is not yet within the error margin. Furthermore, it is assumed that in step 907 it is found that the target resistance level has not been undershot. In step 909, it is then found that the programming scheme operates on the left programming slope. Then in amplitude update step 911, the next pulse amplitude is calculated by applying the following formula:

$$Vg(k+1)=Vg(k)+e(k)$$

Then in another writing step 903 the pulse as determined in step 911 is applied to the PCM cell. Again, in a subsequent reading step 904 the resistance of the PCM cell is measured and in a checking step 905 it is checked whether the error e(k) is now within the error margin. For illustration purposes it is now assumed that in the checking step 905 it is determined that the error is within the error margin and the programming algorithm stops in step 906.

Figure 10:
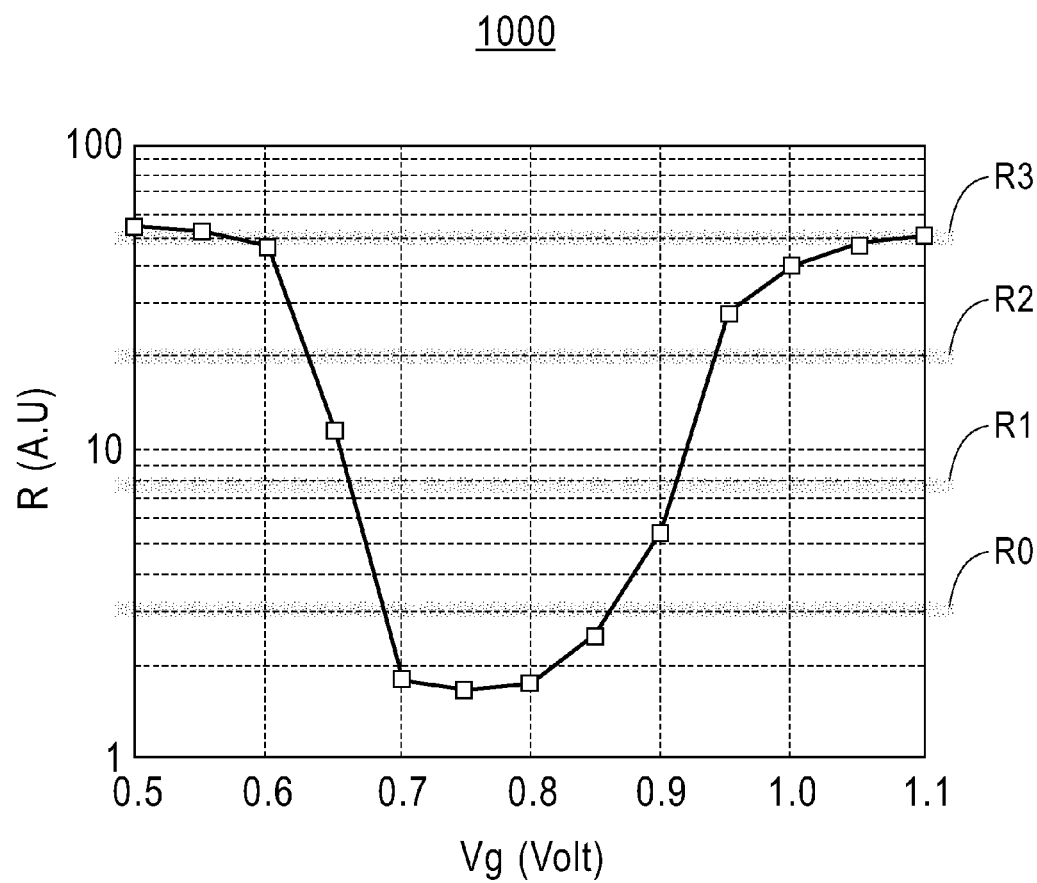
FIG. 10 illustrates a multilevel programming scheme according to an embodiment of the invention having 4 target resistance levels.

FIG. 10 illustrates the 4 resistance levels of a 4-level PCM programming scheme. It shows a Resistance-Gate Voltage (R-Vg) diagram 1000 of a PCM cell including on the vertical axis the resistance R of the PCM cell in Arbitrary Units (A.U.) and on the horizontal axis the applied gate voltage Vg of a FET that controls the current of the PCM cell. The programming scheme includes a first resistance level R3, a second resistance level R2, a third resistance level R1 and a fourth resistance level R0. The resistance levels according to this embodiment of the present invention are equally spaced in log(R) domain. The resistance levels are associated with corresponding error margins .delta.. The error margins .delta. are calculated as a fraction of the distance (.DELTA.) between the levels in log(R) domain.

Figure 11:
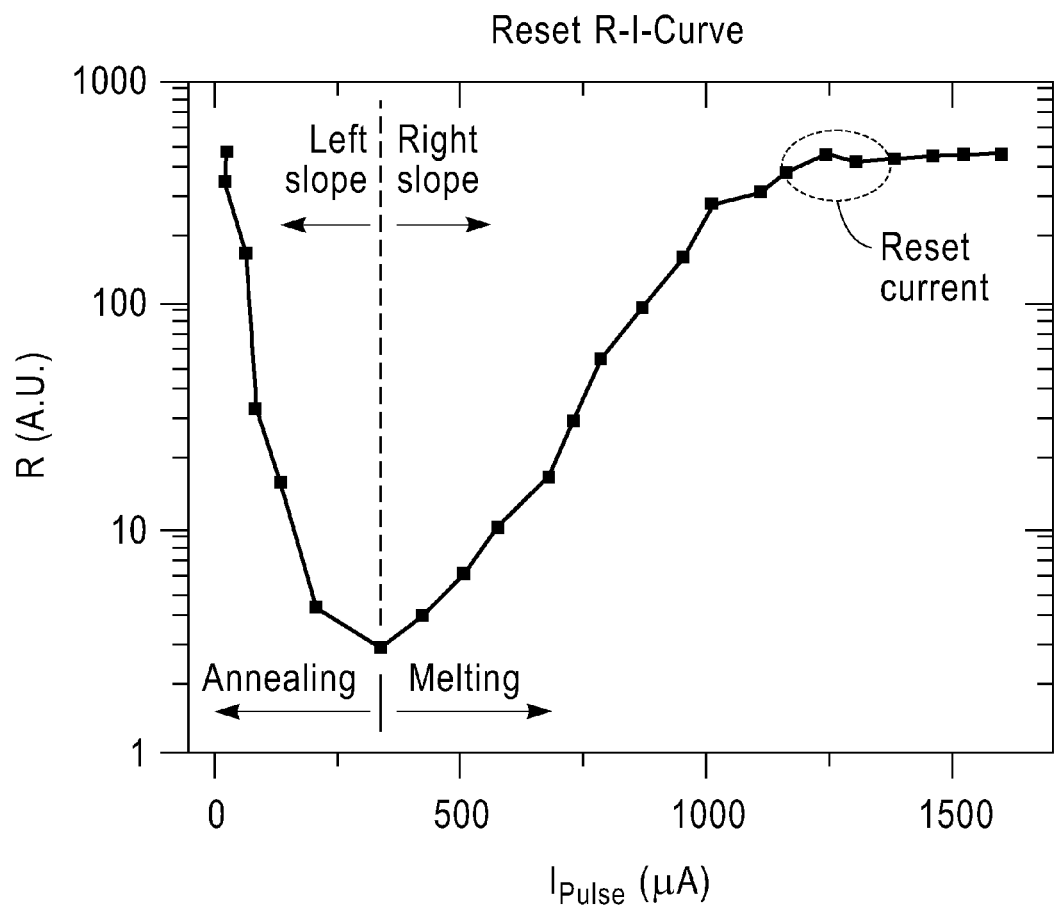
FIG. 11 is a RESET resistance-current curve of a programming scheme of a PCM cell according to an embodiment of the present invention.

FIG. 11 illustrates an exemplary embodiment of a RESET resistance-current curve of a programming scheme of a PCM cell according to an embodiment of the present invention. Programming schemes according to embodiments of the invention start with applying a RESET pulse and are then operated in the first programming mode on the left (downgoing) programming slope of the RESET resistance-current (R-I) curve of the PCM cell. If the target resistance level of the PCM cell has been undershot in the first programming mode, it is switched to the second programming mode, which operates on the right (upgoing) programming slope of the RESET R-I-curve of the PCM cell. The left slope corresponds to annealing steps and the right slope corresponds to melting steps.

Any disclosed embodiment may be combined with one or several of the other embodiments shown and/or described. This is also possible for one or more features of the embodiments.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

ADDITIONAL EMBODIMENT DETAILS

The described techniques may be implemented as a method, apparatus or article of manufacture involving software, firmware, micro-code, hardware and/or any combination thereof. The term "article of manufacture" as used herein refers to code or logic implemented in a medium, where such medium may include hardware logic [for example, an integrated circuit chip, Programmable Gate Array (PGA), and Application Specific Integrated Circuit (ASIC)] or a computer readable medium, such as magnetic storage medium (for example, hard disk drives, floppy disks, and tape), optical storage (for example, CD-ROMs and optical disks), volatile and non-volatile memory devices [for example, Electrically Erasable Programmable Read Only Memory (EEPROM), Read Only Memory (ROM), Programmable Read Only Memory (PROM), Random Access Memory (RAM), Dynamic Random Access Memory (DRAM), Static Random Access Memory (SRAM), flash, firmware and programmable logic].

Code in the computer readable medium is accessed and executed by a processor. The medium in which the code or logic is encoded may also include transmission signals propagating through space or a transmission media, such as an optical fiber or copper wire. The transmission signal in which the code or logic is encoded may further include a wireless signal, satellite transmission, radio waves, infrared signals and Bluetooth. The transmission signal in which the code or logic is encoded is capable of being transmitted by a transmitting station and received by a receiving station, where the code or logic encoded in the transmission signal may be decoded and stored in hardware or a computer readable medium at the receiving and transmitting stations or devices. Additionally, the "article of manufacture" may include a combination of hardware and software components in which the code is embodied, processed, and executed.

Those skilled in the art will recognize that many modifications may be made without departing from the scope of embodiments, and that the article of manufacture may include any information bearing medium. For example, the article of manufacture includes a storage medium having stored therein instructions that when executed by a machine results in operations being performed.

Certain embodiments can take the form of an entirely hardware embodiment, an entirely software embodiment or an embodiment containing both hardware and software elements. In a preferred embodiment, the invention is implemented in software, which includes but is not limited to firmware, resident software and microcode.

Furthermore, certain embodiments can take the form of a computer program product accessible from a computer usable or computer readable medium providing program code for use by or in connection with a computer or any instruction execution system. For the purposes of this description, a computer usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

The terms "certain embodiments", "an embodiment", "embodiment", "embodiments", "the embodiment", "the embodiments", "one or more embodiments", "some embodiments", and "one embodiment" mean one or more (but not all) embodiments unless expressly specified otherwise. The terms "including", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries. Additionally, a description of an embodiment with several components in communication with each other does not imply that all such components are required. On the contrary a variety of optional components are described to illustrate the wide variety of possible embodiments.

Further, although process steps, method steps and algorithms may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously, in parallel, or concurrently.

When a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article. The functionality and/or the features of a device may be alternatively embodied by one or more other devices which are not explicitly described as having such functionality/features. Thus, other embodiments need not include the device itself.

Computer program means or computer program in the present context mean any expression, in any language, code or notation, of a set of instructions intended to cause a system having an information processing capability to perform a particular function either directly or after either or both of the following: a) conversion to another language, code or notation; b) reproduction in a different material form.

The invention claimed is:

1. A computer readable storage medium having computer readable instructions stored thereon that, when executed by a computer, implement a method of performing a program operation of a phase change memory (PCM) cell, the method comprising:

applying one or more programming pulses according to a predefined programming scheme to achieve a target resistance level of the PCM cell, wherein the programming scheme is operable to perform in a first programming mode one or more annealing steps to approach the target resistance level, and wherein the programming scheme is operable to perform in a second programming mode one or more melting steps, wherein the programming scheme is operable to start in the first programming mode and to switch to the second programming mode if the target resistance level of the PCM cell has been undershot in the first programming mode.

2. The computer readable storage medium according to claim 1, wherein by the programming pulses of the annealing steps a memory element of the PCM cell that comprises a phase change material is at least partly heated above the glass temperature of the phase change material of the memory element, but below the melting temperature of the phase change material of the memory element.

3. The computer readable storage medium according to claim 1, wherein by the programming pulses of the melting steps a memory element of the PCM cell that comprises a phase change material is at least partly heated above the melting temperature of the phase change material of the memory element.

4. The computer readable storage medium according to claim 1, wherein, after switching to the second programming mode, the programming scheme is operable to approach the target resistance level in the second programming mode.

5. The computer readable storage medium according to claim 1, wherein the programming scheme is operable to switch back from the second programming mode to the first programming mode in order to re-approach the target resistance level in the first programming mode.

6. The computer readable storage medium according to claim 1, wherein the PCM cell is operated in the first programming mode on a left programming slope of a resistance-current (R-I)-curve of the PCM cell and in the second programming mode on a right programming slope of a R-I-curve of the PCM cell.

7. The computer readable storage medium according to claim 6, wherein the programming scheme is operable to switch from the left programming slope to a switch back point of the right programming slope in a single melting step, wherein the switch back point of the right programming slope is the point from which the programming scheme is operable to switch back from the second programming mode to the first programming mode.

8. The computer readable storage medium according to claim 6, wherein the programming scheme is operable to switch from the left programming slope to a switch back point of the right programming slope in two or more intermediate steps, wherein the switch back point of the right programming slope is the point from which the programming scheme is operable to switch back from the second programming mode to the first programming mode.

9. The computer readable storage medium according to claim 6, wherein the programming scheme is operable to move back from the right programming slope to a return point of the left programming slope, wherein the resistance level of the return point of the left programming slope is chosen above the target resistance level of the PCM-cell.

10. The computer readable storage medium according to claim 1, wherein the programming pulses are voltage or current pulses.

11. The computer readable storage medium according to claim 1, wherein the programming pulses establish a sequence of pulses, the pulses of the sequence having a constant width and variable amplitude.

12. The computer readable storage medium according to claim 1, wherein the amplitude of the programming pulses is controlled by means of an adaptive algorithm establishing an iterative process of write- and read-steps.

* * * * *